United States Patent
Gilchrist et al.

(10) Patent No.: US 10,730,082 B2
(45) Date of Patent: Aug. 4, 2020

(54) APPARATUS AND METHOD FOR DIFFERENTIAL IN SITU CLEANING

(71) Applicant: Varian Semiconductor Equipment Associates, Inc., Gloucester, MA (US)

(72) Inventors: Glen F R Gilchrist, Danvers, MA (US); Costel Biloiu, Rockport, MA (US); Shurong Liang, Lynnfield, MA (US); Christopher R. Campbell, Newburyport, MA (US); Vikram Singh, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 330 days.

(21) Appl. No.: 15/334,732

(22) Filed: Oct. 26, 2016

(65) Prior Publication Data

US 2018/0111171 A1  Apr. 26, 2018

(51) Int. Cl.
*B08B 7/00* (2006.01)
*H01J 37/32* (2006.01)
*C23C 16/44* (2006.01)

(52) U.S. Cl.
CPC ............ *B08B 7/00* (2013.01); *C23C 16/4405* (2013.01); *H01J 37/32458* (2013.01); *H01J 37/32513* (2013.01); *H01J 37/32862* (2013.01)

(58) Field of Classification Search
CPC . B08B 7/00; H01J 37/32458; H01J 37/32513; H01J 37/32862; H01J 37/4405; C23C 16/4405

(Continued)

(56) References Cited

U.S. PATENT DOCUMENTS 5,079,481 A  * 1/1992 Moslehi ............ H01J 37/3266
                                              118/723 E
5,611,863 A  * 3/1997 Miyagi ............... C23C 16/4405
                                              118/723 MP (Continued)

FOREIGN PATENT DOCUMENTS

JP    2009-16453 A    1/2009
JP    2012-138411 A   7/2012

OTHER PUBLICATIONS

International Search Report and Written Opinion dated Dec. 19, 2017 in corresponding PCT application No. PCT/US2017/050946.

*Primary Examiner* — David G Cormier
*Assistant Examiner* — Thomas Bucci
(74) *Attorney, Agent, or Firm* — Nields, Lemack & Frame, LLC

(57) ABSTRACT

A workpiece processing apparatus allowing in situ cleaning of metal deposited formed on the extraction plate and in the plasma chamber is disclosed. The apparatus includes an extraction plate having an extraction aperture through which the sputtering material is passed. The apparatus also includes a sealed volume disposed within the plasma chamber which is in communication with a cleaning aperture on the extraction plate. The sealed volume is in communication with a cleaning gas, which is excited by the plasma in the plasma chamber, and can be used to clean the exterior surface of the extraction plate. The feed gas used in the plasma chamber can be selected from a sputtering species and the cleaning gas. Since the volume in the sealed volume is separated from the rest of the plasma chamber, the cleaning of the extraction plate and the cleaning of the plasma chamber may be performed independently.

18 Claims, 7 Drawing Sheets

(58) Field of Classification Search
USPC .............. 134/56 R, 1.1, 22.18, 1.2, 1, 22.1
See application file for complete search history.

(56) References Cited

U.S. PATENT DOCUMENTS

| | | | | |
|---|---|---|---|---|
| 5,633,506 A * | 5/1997 | Blake | ............... | H01J 37/3002 250/492.21 |
| 6,194,628 B1 * | 2/2001 | Pang | ............... | B01J 19/249 96/234 |
| 6,313,905 B1 * | 11/2001 | Brugger | ............... | G03F 7/2047 355/53 |
| 6,992,311 B1 * | 1/2006 | Ring | ............... | H01J 37/3171 250/423 R |
| 7,183,219 B1 * | 2/2007 | Hama | ............... | H01L 21/31116 438/706 |
| 7,977,628 B2 * | 7/2011 | Grant | ............... | H01J 37/04 250/288 |
| 8,455,839 B2 * | 6/2013 | Chaney | ............... | H01J 37/08 134/6 |
| 8,497,486 B1 * | 7/2013 | Blahnik | ............... | H01J 27/08 250/423 R |
| 8,603,591 B2 * | 12/2013 | Godet | ............... | C23C 16/045 118/723 R |
| 8,937,004 B2 * | 1/2015 | Renau | ............... | H01J 37/3171 438/513 |
| 2002/0117637 A1 * | 8/2002 | Donaldson | ............... | H01J 27/04 250/492.21 |
| 2004/0104683 A1 * | 6/2004 | Leung | ............... | H05H 1/46 315/111.81 |
| 2006/0060566 A1 * | 3/2006 | Puech | ............... | H01J 37/32477 216/67 |
| 2006/0086376 A1 * | 4/2006 | Dimeo | ............... | C23C 14/564 134/22.1 |
| 2006/0272775 A1 * | 12/2006 | Horsky | ............... | C23C 14/564 156/345.37 |
| 2007/0210260 A1 * | 9/2007 | Horsky | ............... | C23C 14/564 250/424 |
| 2007/0281478 A1 * | 12/2007 | Ikegami | ............... | H01J 37/32082 438/689 |
| 2008/0223409 A1 * | 9/2008 | Horsky | ............... | C23C 14/564 134/22.1 |
| 2009/0008034 A1 | 1/2009 | Tahara et al. | | |
| 2009/0014667 A1 * | 1/2009 | Hahto | ............... | H01J 37/08 250/492.21 |
| 2010/0255665 A1 * | 10/2010 | Godet | ............... | C23C 14/48 438/513 |
| 2010/0262302 A1 * | 10/2010 | Yamane | ............... | G05B 23/0256 700/282 |
| 2010/0330787 A1 * | 12/2010 | Sferlazzo | ............... | H01L 21/2658 438/514 |
| 2011/0139748 A1 * | 6/2011 | Donnelly | ............... | H01J 37/32146 216/37 |
| 2011/0186749 A1 * | 8/2011 | Godet | ............... | H01J 37/08 250/424 |
| 2012/0241412 A1 * | 9/2012 | Murakami | ............... | C23C 16/4405 216/67 |
| 2012/0248328 A1 * | 10/2012 | Renau | ............... | H01J 27/024 250/398 |
| 2012/0263887 A1 * | 10/2012 | Papasouliotis | ............... | C23C 16/45551 427/569 |
| 2013/0052810 A1 * | 2/2013 | Darby | ............... | C23C 16/28 438/508 |
| 2014/0027274 A1 * | 1/2014 | Godet | ............... | H01J 37/3467 204/298.06 |
| 2014/0037858 A1 * | 2/2014 | Ma | ............... | H01J 37/32403 427/523 |
| 2014/0038393 A1 * | 2/2014 | Godet | ............... | H01J 37/32366 438/478 |
| 2014/0234554 A1 * | 8/2014 | Radovanov | ............... | C23C 16/045 427/569 |
| 2014/0256121 A1 * | 9/2014 | Radovanov | ............... | H01L 21/2658 438/513 |
| 2014/0272179 A1 * | 9/2014 | Radovanov | ............... | H01J 37/32357 427/523 |
| 2014/0283745 A1 * | 9/2014 | Nagai | ............... | H01J 37/08 118/692 |
| 2015/0101634 A1 * | 4/2015 | Leavitt | ............... | H01J 27/022 134/1.1 |
| 2015/0179409 A1 * | 6/2015 | Biloiu | ............... | H01J 37/32568 216/66 |
| 2015/0371827 A1 * | 12/2015 | Godet | ............... | H01J 37/3172 216/67 |
| 2016/0013030 A1 * | 1/2016 | Venugopal | ............... | H01J 37/32357 216/67 |
| 2016/0148789 A1 * | 5/2016 | Chen | ............... | H01J 37/32422 134/1.2 |
| 2017/0025252 A1 * | 1/2017 | Liang | ............... | H01J 37/32357 |
| 2017/0042010 A1 * | 2/2017 | Liang | ............... | H01L 21/3065 |
| 2017/0062185 A1 * | 3/2017 | Wallace | ............... | H01J 37/3056 |

* cited by examiner

APPARATUS AND METHOD FOR DIFFERENTIAL IN SITU CLEANING

FIELD

Embodiments of the present disclosure relate to differential in situ cleaning of metal deposits, and more particularly metal deposits created by selective area processing of a workpiece.

BACKGROUND

Selective Area Processing is a technique where material, typically metal, is removed from a workpiece. The removal of this material is traditionally accomplished using a sputtering process.

In certain systems, a sputtering material, such as argon, is extracted from a plasma chamber through an extraction aperture toward the workpiece. The extraction optics of the plasma chamber may include an extraction plate, which is located in close proximity, such as between 7 and 20 mm, from the workpiece. The sputtering material impacts the workpiece, causing a metal on the workpiece to be removed.

However, there are several issues associated with selective area processing, such as particle generation and beam current drift. As the argon strikes the workpiece, metal atoms, such as tungsten, are removed. These metal atoms obey a Lambertian distribution and as a result, most of the removed metal atoms redeposit on the extraction plate or enter the plasma chamber through the extraction aperture. The material that arrives at the extraction plate grows in a thin film, and when its thickness reaches a certain value, the film exfoliates, generating particles, which may contaminate the workpiece. The material that enters the plasma chamber may deposit on the dielectric window, which is disposed between the plasma chamber and the RF antenna. Since these metal atoms are conductive, they reduce the RF power coupling efficiency, thus reducing plasma density and extraction ion beam current during operation.

Currently, these issues are resolved by a maintenance process, where the plasma chamber is shut down for an extended period of time so that the surfaces may all be cleaned. After cleaning is complete, vacuum is re-established and the plasma chamber is ready for use. However, this down time hurts operational efficiency and reduces throughput.

Thus, it would be beneficial if there was an apparatus which could control allow fast, automated in situ cleaning of these metal deposits. Further, it would beneficial if the apparatus could clean the deposits on the extraction plate and within the plasma chamber at different rates, if desired. Such an apparatus may be beneficial in certain applications, such as selective area processing.

SUMMARY

A workpiece processing apparatus allowing in situ cleaning of metal deposits formed on the extraction plate and on the dielectric window is disclosed. The apparatus includes an extraction plate having an extraction aperture through which the sputtering material is passed. The apparatus also includes a sealed volume disposed within the plasma chamber which is in communication with a cleaning aperture on the extraction plate. The sealed volume is in communication with a cleaning gas, which is excited by the plasma in the plasma chamber, and can be used to clean the exterior surface of the extraction plate. The feed gas used in the plasma chamber can be selected from a sputtering species, such as argon, and the cleaning gas. Since the volume in the sealed volume is separated from the rest of the plasma chamber, the cleaning of the extraction plate and the cleaning of the plasma chamber may be performed independently.

According to one embodiment, a workpiece processing apparatus is disclosed. The workpiece processing apparatus comprises a plasma generator; an extraction plate having an extraction aperture and a cleaning aperture; a plasma chamber in communication with the extraction aperture; a sealed volume disposed within the plasma chamber and in communication with the cleaning aperture; and a tube mass flow controller in communication with the sealed volume to control a flow of a cleaning gas into the sealed volume. In certain embodiments, the apparatus comprises a chamber mass flow controller to control a flow of the cleaning gas into the plasma chamber. In certain embodiments, the tube mass flow controller and chamber mass flow controller are independently controlled. In certain embodiments, the apparatus comprises a controller, in communication with the tube mass flow controller and the chamber mass flow controller, such that the controller can cause the apparatus to operate in a plurality of different modes. These modes may include a normal operating mode, an extraction plate cleaning mode, a chamber only cleaning mode, an apparatus cleaning mode and an operational cleaning mode.

According to another embodiment, a workpiece processing apparatus is disclosed. The workpiece processing apparatus comprises an extraction plate having an extraction aperture and a cleaning aperture; a plasma chamber in communication with the extraction aperture; a sealed volume disposed within the plasma chamber and in communication with the cleaning aperture; and a controller to control a flow of feed gas into the plasma chamber, a flow of a cleaning gas into the plasma chamber and a flow of cleaning gas into the sealed volume, so as to independently control cleaning of an interior of the plasma chamber and an exterior surface of the extraction plate. In certain embodiments, a workpiece is disposed on a platen, where the platen is biased using a bias power supply, and the controller is in communication with the bias power supply. In certain embodiments, the controller flows feed gas into the plasma chamber, and a workpiece is biased such that ions are attracted from the plasma chamber toward the workpiece when the workpiece is disposed proximate the extraction aperture, and the controller flows cleaning gas into the sealed volume when the workpiece is not biased.

According to another embodiment, a workpiece processing apparatus is disclosed. The workpiece processing apparatus comprises a plasma generator; an extraction plate having an extraction aperture and a cleaning aperture; a plasma chamber in communication with the extraction aperture; a sealed volume disposed within the plasma chamber and in communication with the cleaning aperture and in communication with a source of a cleaning gas; a platen disposed outside the plasma chamber; and a dummy wafer disposed on the platen, wherein the dummy wafer comprises a surface that does not react with metastable atoms of the cleaning gas. In certain embodiments, the surface comprises sapphire, alumina, aluminum or aluminum trifluoride.

BRIEF DESCRIPTION OF THE FIGURES

For a better understanding of the present disclosure, reference is made to the accompanying drawings, which are incorporated herein by reference and in which.

DETAILED DESCRIPTION

The present apparatus utilizes the fact that many metals can form a volatile compound, when combined with another element. For example, in one embodiment, tungsten may be disposed on the workpiece. When subjected to sputtering, the tungsten atoms may be deposited on the extraction plate. It is known that tungsten combines with fluorine to form tungsten hexafluoride ($WF_6$), which is stable and volatile. This gas can then be removed via vacuum pumping. Similarly, other metals may also be combined with other elements to form stable, volatile gasses. For example, various metals may react with fluorine to form gaseous hexafluoride compounds. However, certain metals may form gaseous compounds when combined with chlorine or other halogens. Thus, while the present disclosure describes the use of fluorine to remove tungsten deposits, the disclosure is not limited to only this embodiment.

Figure 1:
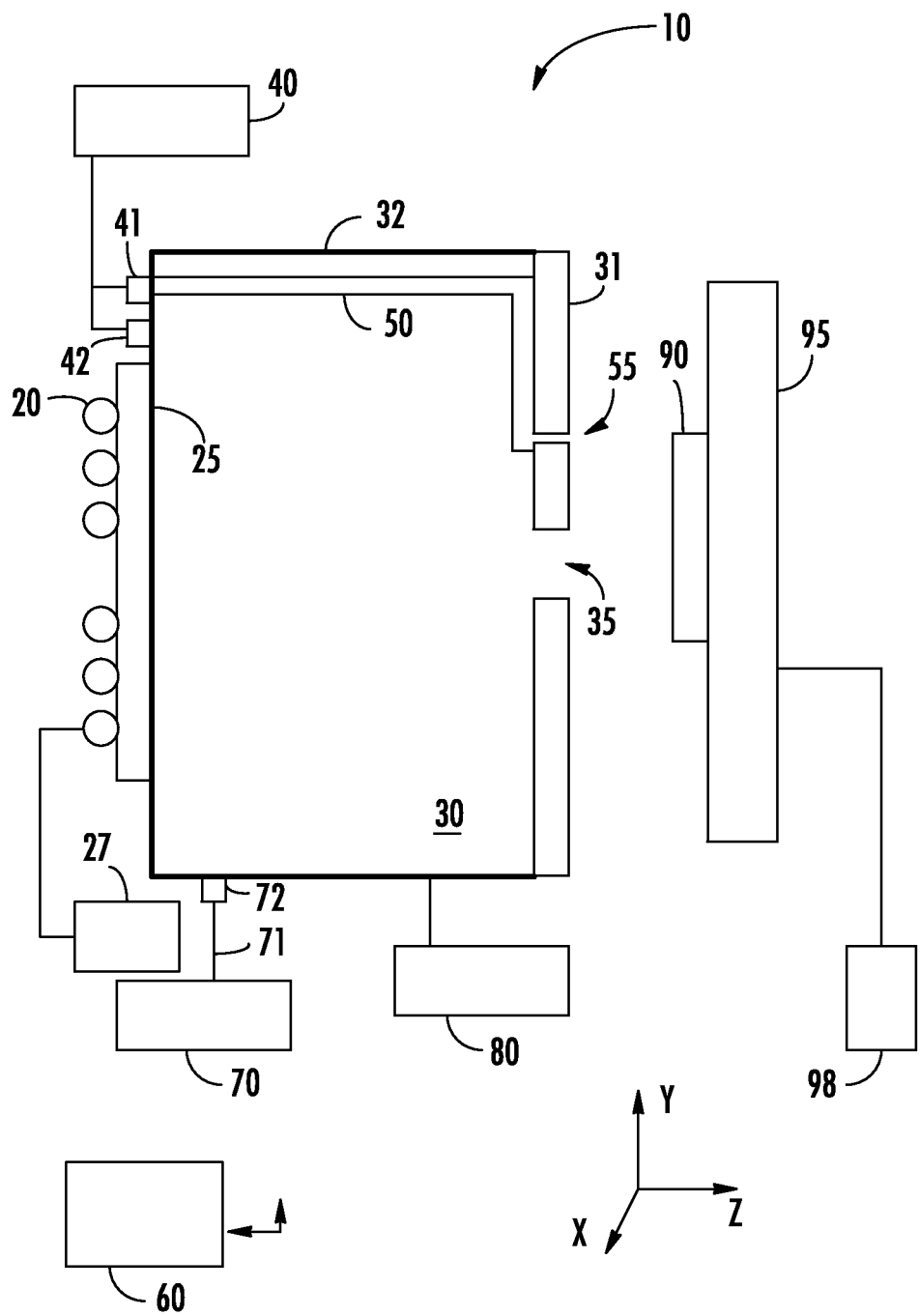
FIG. 1 is a workpiece processing apparatus in accordance with one embodiment.

FIG. 1 shows a first embodiment of workpiece processing apparatus 10 for removing metal deposits that are created by a sputtering process. The workpiece processing apparatus 10 comprises a plasma chamber 30, which is defined by a plurality of chamber walls 32.

An antenna 20 is disposed external to a plasma chamber 30, proximate a dielectric window 25. The dielectric window 25 may also form one of the walls that define the plasma chamber 30. The antenna 20 is electrically connected to a RF power supply 27, which supplies an alternating voltage to the antenna 20. The voltage may be at a frequency of, for example, 2 MHz or more. While the dielectric window 25 and antenna 20 are shown on one side of the plasma chamber 30, other embodiments are also possible. For example, the antenna 20 may surround the chamber walls 32 or be disposed on the top of the plasma chamber 30. The chamber walls 32 of the plasma chamber 30 may be made of a conductive material, such as graphite. These chamber walls 32 may be biased at an extraction voltage, such as by extraction power supply 80. The extraction voltage may be, for example, 1 kV, although other voltages are within the scope of the disclosure. In some embodiments, the chamber walls 32 are grounded and an extraction power supply 80 is not used.

The workpiece processing apparatus 10 includes an extraction plate 31 having an extraction aperture 35. The extraction plate 31 may form another wall that defines plasma chamber 30. The extraction aperture 35 may be about 320 mm in the x-direction and 30 mm in the y-direction, although other dimensions are possible. The extraction plate 31 may have a thickness in the z-direction of between 5 and 10 mm, although other dimensions are also possible. This extraction plate 31 may be disposed on the side of the plasma chamber 30 opposite the dielectric window 25, although other configurations are also possible. In certain embodiments, the extraction plate 31 may be constructed from an insulating material. For example, the extraction plate 31 may comprise quartz, sapphire, alumina or a similar insulating material. The use of an insulating material may allow modulation of the plasma sheath, which affects the angle at which charged ions exit the extraction aperture 35. In other embodiments, the extraction plate 31 may be constructed of a conducting material, such as titanium or aluminum.

In certain embodiments, the apparatus 10 includes a sealed tube 50 disposed within the plasma chamber 30. The sealed tube 50 is in communication with a cleaning aperture 55 on the extraction plate 31. An opposite end of the sealed tube 50 is in communication with a tube mass flow controller 41 (MFC). A cleaning gas source 40 is in fluid communication with the tube mass flow controller 41. The cleaning gas may be any suitable gas. In certain embodiments, the cleaning gas may include a halogen, such as fluorine or chlorine. In one particular embodiment, the cleaning gas may be $NF_3$. The cleaning gas source 40 is also in communication with a chamber mass flow controller 42. The use of two separate mass flow controllers 41, 42 allows the flow of cleaning gas to the plasma chamber 30 and the sealed tube 50 to be independently controlled.

A workpiece 90 is disposed proximate and outside the extraction plate 31 of the plasma chamber 30. In some embodiments, the workpiece 90 may be about 7 to 20 mm from the extraction plate 31 in the z-direction, although other distances are also possible.

A controller 60 may be used to control the operation of the apparatus 10. The controller 60 includes a processing unit and an associated memory device. This memory device contains the instructions, which, when executed by the processing unit, enable the controller 60 to perform the functions described herein. This memory device may be a non-volatile memory, such as a FLASH ROM, an electrically erasable ROM or other suitable devices. In other embodiments, the memory device may be a volatile memory, such as a RAM or DRAM. In certain embodiments, the memory device may be packaged with the processing unit. The processing unit may be any suitable device, including but not limited to a general purpose processor, an application specific processor, an embedded controller, or a personal computer (PC). The controller 60 may be in communication with the various mass flow controllers and power supplies, and may control their operation so as to allow the apparatus 10 to be deployed in a variety of different modes.

In normal operation, the antenna 20 is powered using a RF signal from the RF power supply 27 so as to inductively couple energy into the plasma chamber 30. This inductively coupled energy excites the feed gas introduced from a feed gas source 70 via gas inlet 71. The feed gas may be any suitable gas. In certain embodiments, a gas that is suited for sputtering is used. In one particular embodiment, argon may be used as the feed gas. The feed gas may flow through a feed gas mass flow controller 72 into the plasma chamber 30. Thus, the plasma chamber 30 has multiple inputs. A cleaning gas may be introduced to the plasma chamber 30 via chamber mass flow controller 42. Feed gas may be introduced to the plasma chamber via feed gas mass flow controller 72. These two mass flow controllers may be independently controlled. This configuration allows the plasma chamber 30 to be fed with only feed gas, only cleaning gas, or a combination of the two gasses, depending on the state of the mass flow controllers.

In normal operation, the feed gas mass flow controller 72 is opened, allowing feed gas to flow into the plasma chamber 30. The energy supplied by the antenna 20 generates a plasma. While FIG. 1 shows an antenna, other plasma generators may also be used with the present disclosure. For example, a capacitively coupled plasma generator may be used.

The plasma within the plasma chamber 30 may be biased at the voltage being applied to the chamber walls 32 by the extraction power supply 80. The workpiece 90, which may be disposed on a platen 95, is disposed proximate the extraction plate 31. The platen 95 may be electrically biased by a bias power supply 98. The difference in potential between the plasma and the workpiece 90 causes charged ions in the plasma to be accelerated through the extraction aperture 35 in the form of one or more ribbon ion beams and toward the workpiece 90. In other words, positive ions are attracted toward the workpiece 90 when the voltage applied by the extraction power supply 80 is more positive than the bias voltage applied by the bias power supply 98. Thus, to extract positive ions, the chamber walls 32 may be biased at a positive voltage, while the workpiece 90 is biased at a less positive voltage, ground or a negative voltage. In other embodiments, the chamber walls 32 may be grounded, while the workpiece 90 is biased at a negative voltage. In yet other embodiments, the chamber walls 32 may be biased at a negative voltage, while the workpiece 90 is biased at a more negative voltage.

Further, the platen 95 and workpiece 90 may be translated relative to the extraction aperture 35 such that different portions of the workpiece 90 are exposed to the ion beam. The process wherein the workpiece 90 is translated so that the entire workpiece 90 is exposed to the ribbon ion beam is referred to as "a pass". A pass may be performed by translating the platen 95 and workpiece 90 while maintaining the position of the plasma chamber 30. The speed at which the workpiece 90 is translated relative to the extraction aperture 35 may be referred to as workpiece scan velocity. In another embodiment, the plasma chamber 30 may be translated while the workpiece 90 remains stationary. In other embodiments, both the plasma chamber 30 and the workpiece 90 may be translated. In some embodiments, the workpiece 90 moves at a constant workpiece scan velocity relative to the extraction aperture 35 in the y-direction, so that the entirety of the workpiece 90 is exposed to the ribbon ion beam for the same amount of time.

A similar process is used to clean the interior of the plasma chamber 30. In chamber cleaning mode, the flow of feed gas to the plasma chamber is stopped by actuating the feed gas mass flow controller 72. The flow of cleaning gas to the plasma chamber 30 is enabled by actuating chamber mass flow controller 42. The antenna 20 is energized as described above to create a plasma with the cleaning gas. In chamber cleaning mode, the workpiece 90 may not be translated, since the ions are not intended for the workpiece. Further, the chamber walls 32 may be biased by extraction power supply 80 at a voltage that is equal to or less positive than the voltage applied by the bias power supply 98. For example, if the chamber walls 32 are grounded, the workpiece 90 may be biased at a positive voltage. This voltage configuration does not attract ions from the plasma chamber 30 toward the workpiece 90.

Thus, normal operation and chamber cleaning mode are similar in that both utilize energy supply from the antenna 20 to create a plasma in the plasma chamber 30. The major differences between these two modes is the species of gas used during each mode and whether ions from the plasma are attracted toward the workpiece 90. It is noted that, in chamber cleaning mode, a mixture of feed gas and cleaning gas may be introduced into the plasma chamber 30.

Advantageously, the apparatus 10 includes a third mode of operation, referred to as extraction plate cleaning mode. Extraction plate cleaning mode can be performed in parallel with either normal operating mode or with chamber cleaning mode, as will be described in more detail below.

As noted above, the apparatus 10 includes a sealed tube 50 in communication with a tube mass flow controller 41. In extraction plate cleaning mode, cleaning gas flows from the cleaning gas source 40 through the tube mass flow controller 41 and into the sealed tube 50. The sealed tube 50 may be constructed of a material which is transparent to RF energy. For example, sapphire or quartz may be used to construct the sealed tube 50.

The antenna 20 is energized to create a plasma in the plasma chamber 30. This plasma may be formed from either the feed gas or the cleaning gas. The energy in the plasma chamber causes the cleaning gas within the sealed tube 50 to become excited. Atoms of the cleaning gas are excited by the plasma and enter an excited state, referred to metastable atoms. In certain embodiments, ions of the cleaning gas are also formed. These metastable atoms flow through the cleaning aperture 55 into the space between the extraction plate 31 and the workpiece 90. Since this space is very narrow, the metastable atoms flow across the face of the extraction plate 31.

In the case of tungsten deposits, the metastable atoms may be fluorine, which combine with the tungsten deposits to form $WF_6$, which is then pumped out of the apparatus. In other embodiments, radicals such as hydrogen, oxygen, chlorine and bromine atoms or other species, may combine with the process residue to form volatile compounds which may be removed by vacuum pumping.

The use of a sealed tube 50 and three mass flow controllers allows a variety of modes of operation.

First, there is a normal operating mode. In this mode, tube mass flow controller 41 and chamber mass flow controller 42 are disabled, while feed gas mass flow controller 72 is enabled. The antenna 20 is actuated and the bias power supply 98 is pulsed to allow ions of the feed gas to be attracted toward the workpiece 90. As described above, the workpiece 90 may be translated in the y-direction during normal operating mode so that all of the workpiece 90 is exposed to the ions that are extracted through the extraction aperture 35. In this mode, no gas flows in the sealed tube 50.

Second, there is an apparatus cleaning mode. In this mode, tube mass flow controller 41 and chamber mass flow controller 42 are enabled, while feed gas mass flow controller 72 may be disabled. Thus, cleaning gas enters both the plasma chamber 30 and the sealed tube 50. The antenna 20 is actuated to create a plasma that cleans the interior of the plasma chamber 30, and also excites the cleaning gas in the sealed tube 50. The excited cleaning gas exits the sealed tube 50 through the cleaning aperture 55 and flows across the face of the extraction plate 31. The bias voltage may not be pulsed in this mode, as the ions of cleaning gas are not intended to impact the workpiece 90. To effectively clean the face of the extraction plate 31, the platen 95 is disposed in front of the extraction plate 31, so as to create a narrow space between the extraction plate 31 and the platen 95. In certain embodiments, during this mode, the workpiece 90 is replaced with a dummy wafer. The dummy wafer comprises, on its surface, a material that does not react with the metastable atoms. For example, the dummy wafer may have a surface made of sapphire, alumina, aluminum or aluminum trifluoride. The use of a dummy wafer may provide two benefits. First, it may reduce or prevent damage to the underlying platen 95. Second, since the dummy wafer is non-reactive with the metastable atoms, a higher population of these metastable atoms is available to clean the extraction plate 31.

Third, there is a chamber only cleaning mode. This is similar to the apparatus cleaning mode, except that tube mass flow controller 41 is disabled. In this mode, the interior of the plasma chamber 30 is cleaned by the cleaning gas, but the extraction plate 31 is not cleaned.

Fourth, there is an extraction plate cleaning mode. In this mode, tube mass flow controller 41 and feed gas mass flow controller 72 are enabled, while chamber mass flow controller 42 is disabled. Thus, cleaning gas enters the sealed tube 50, while feed gas enters the plasma chamber 30. The antenna 20 is actuated to create a plasma in interior of the plasma chamber 30, and also excites the cleaning gas in the sealed tube 50. The excited cleaning gas exits the sealed tube 50 through the cleaning aperture 55 and flows across the face of the extraction plate 31. The bias voltage may not be pulsed in this mode, as the ions of feed gas in the plasma chamber 30 are not intended to impact the workpiece 90. As described above, to effectively clean the face of the extraction plate 31, the platen 95 is disposed in front of the extraction plate 31, so as to create a narrow space between the extraction plate 31 and the platen 95. In certain embodiments, during this mode, the workpiece 90 is replaced with a dummy wafer, as described above. Thus, in this mode, the extraction plate 31 is cleaned, while the plasma chamber 30 is not subjected to a cleaning process.

In a variation of this extraction plate cleaning mode, the feed gas mass flow controller 72 is disabled, such that the only gas being flowed is into the sealed tube 50. The energy from the antenna 20 excites the cleaning gas in the sealed tube 50, which then flows across the face of the extraction plate 31.

In another variation of this extraction plate cleaning mode, a gas that readily dissociates is used as the cleaning gas. In this embodiment, the antenna 20 is not energized, and gas may not be flowing into the plasma chamber 30. Rather, a cleaning gas, such as $XeF_2$ flows through the tube mass flow controller 41 and into the sealed tube 50. Since the cleaning gas is readily dissociative, it decomposes into xenon and metastable fluorine atoms. These metastable fluorine atoms exit the sealed tube 50 through the cleaning aperture 55 and flow across the face of the extraction plate 31.

Figure 2:
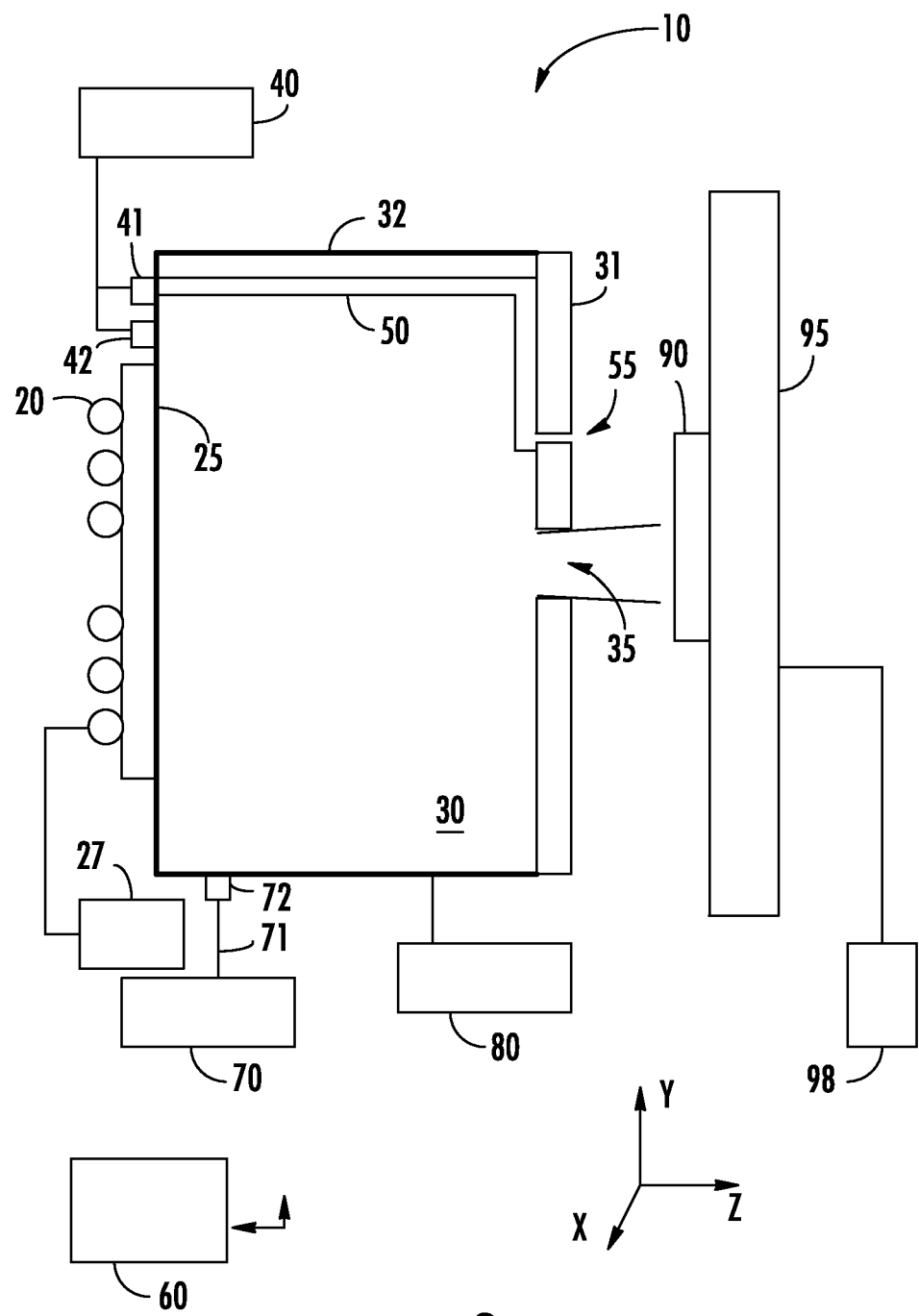
FIG. 2 is view of the workpiece processing apparatus of FIG. 1 in normal operating mode.
Figure 3:
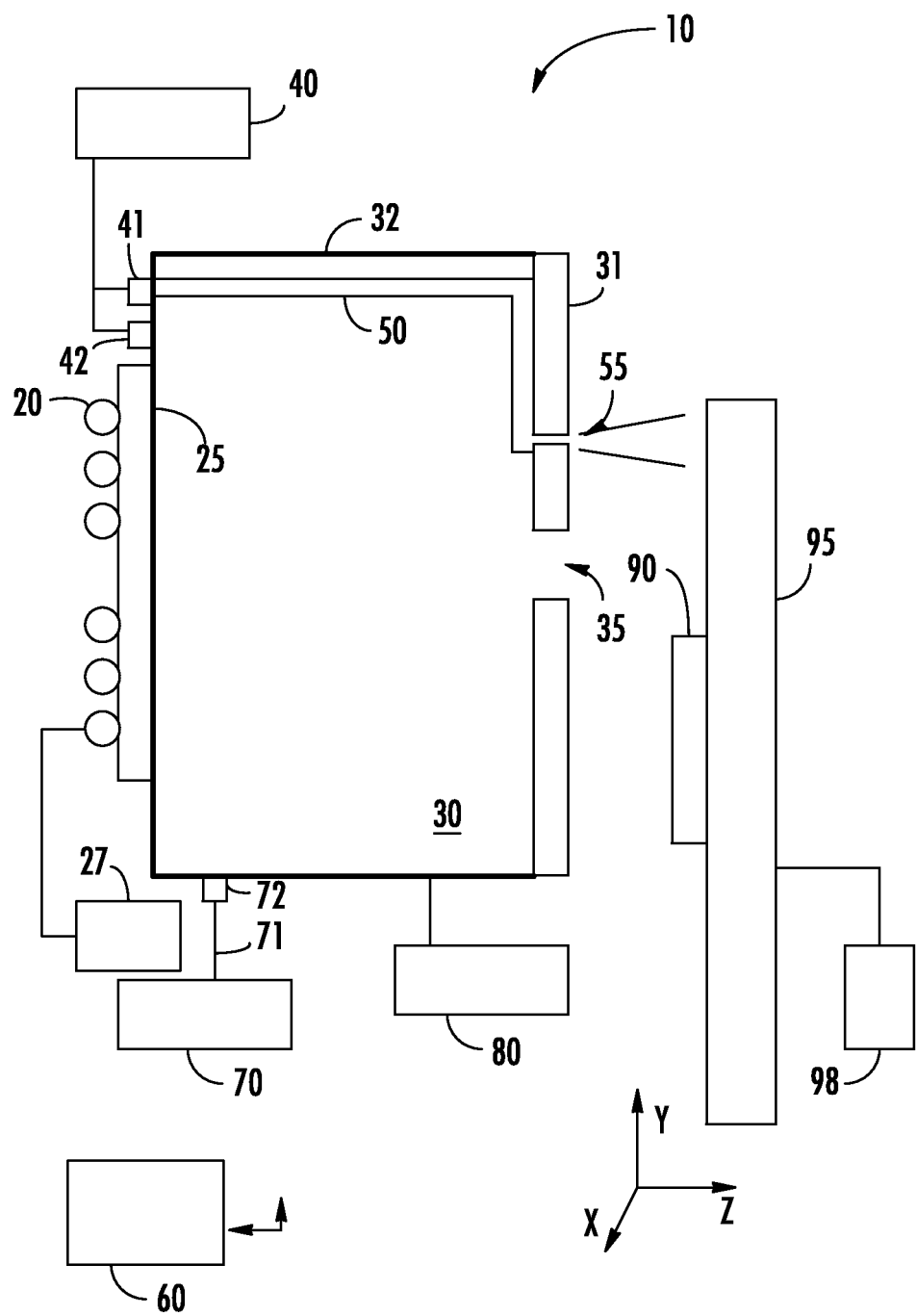
FIG. 3 is a view of the workpiece processing apparatus of FIG. 1 in extraction plate cleaning mode.

Fifth, there may be an operational cleaning mode. This mode is similar to the extraction plate cleaning mode in that the gasses used in this mode are the same as are used in that mode. However, in this mode, the bias power supply 98 may be used to pulse the bias voltage so as to attract ions from the plasma chamber 30 toward the workpiece 90 during certain time periods. Additionally, the tube mass flow controller 41 may also be pulsed so as to allow metastable atoms to exit the cleaning aperture 55 only during certain time periods. For example, while any portion of the workpiece 90 is disposed in front of the extraction aperture 35, as shown in FIG. 2, the apparatus may operate in normal operating mode, where there is no gas flow in the sealed tube 50. However, when the workpiece 90 passes the extraction aperture, such as is shown in FIG. 3, the bias power supply 98 is disabled, and the tube mass flow controller 41 is enabled. During this time period, metastable atoms flow through the cleaning aperture 55 into the volume between the platen 95 and the extraction plate 31. Once the platen 95 has moved sufficiently so that the workpiece 90 is again proximate the extraction aperture 35, the tube mass flow controller 41 is disabled and the bias voltage is turned on again.

Beginning with the position of the workpiece 90 shown in FIG. 2, assume that the platen 95 is moving downward in the y-direction. The apparatus 10 may remain in normal operating mode, as shown in FIG. 2, until the top edge of the workpiece 90 passes the bottom edge of the extraction aperture 35. At this point, the bias voltage may be disabled and the tube mass flow controller 41 may be enabled so that metastable atoms exit through the cleaning aperture 55, as shown in FIG. 3. As the platen 95 continues moving downward, the apparatus 10 stays in this mode. At some time, the platen 95 reaches the lowermost position and reverses direction, so that it is now moving upward along the y-direction. At or before the upper edge of the workpiece 90 reaches the lower edge of the extraction aperture 35, the tube mass flow controller 41 is disabled and the bias power supply 98 is enabled. Thus, the apparatus returns to normal operating mode, where it remains until the lower edge of the workpiece 90 reaches the upper edge of the extraction aperture 35. At or after this point, the bias voltage may be disabled and the tube mass flow controller 41 may be enabled again. At some time, the platen 95 reaches the uppermost position and reverses direction again, so that it begins moving downward in the y-direction. At or before the lower edge of the workpiece 90 reaches the upper edge of the extraction aperture 35, the tube mass flow controller 41 is disabled and the bias power supply 98 is enabled. This cycle can repeat as many times as desired. This sequence may be controlled by the controller 60. The controller 60 may either control or monitor the movement of the platen 95 and control the operation of the various power supplies and mass flow controllers based on the position of the platen 95 relative to the extraction aperture 35.

Thus, at least five different modes of operation are possible through the use of multiple mass flow controllers and a sealed tube 50. The configuration of the various components in each of these modes is summarized in Table 1 below. As described above, the controller 60 may be configured to cause any of these modes to be deployed.

TABLE 1

| Mode | Tube MFC | Chamber MFC | Feed gas MFC | Bias voltage | Workpiece |
| --- | --- | --- | --- | --- | --- |
| Normal operating | OFF | OFF | ON | Pulsed | Normal |
| Apparatus cleaning | ON | ON | OFF* | OFF | Dummy/normal |
| Chamber only cleaning | OFF | ON | OFF* | OFF | Dummy/normal |
| Extraction plate cleaning | ON | OFF | ON | OFF | Dummy/normal |
| Operational cleaning | Pulsed | OFF | ON | Pulsed | normal |

Various modifications of this apparatus are possible. For example, FIGS. 1-3 show a single sealed tube 50 disposed on one side of the extraction aperture 35. In another embodiment, shown in FIG. 4, a second sealed tube 51 may be disposed on the opposite side of the extraction aperture 35. This second sealed tube 51 may be in communication with the tube mass flow controller 41 and with a second cleaning aperture 56. In other embodiments, a second tube mass flow controller may be utilized with the second sealed tube 51. The use of a second cleaning aperture 56 may provide more uniform cleaning of the extraction plate 31.

Additionally, the above description and table shows that the bias voltage is turned off during various modes of operation. However, in certain embodiments, the bias voltage may be made more positive than the voltage applied to the chamber walls 32 by the extraction power supply 80. This may serve to repel the ions back into the plasma chamber 30, maximizing the cleaning effect.

Further, the above description states that the feed gas mass flow controller 72 is off during mode where the plasma chamber is being cleaned. However, in certain embodiments, the feed gas mass flow controller 72 may be enabled to allow a mixture of feed gas and cleaning gas to enter the plasma chamber 30. This may allow the cleaning of the interior of the plasma chamber 30 to be tuned.

The mass flow controllers may also be enabled at different rates. In other words, the rate of flow through the mass flow controllers may be different in certain modes. For example, in apparatus cleaning mode, the rate of flow of the cleaning gas into the sealed tube 50 and the plasma chamber 30 may be adjusted so that the interior of the plasma chamber and the extraction plate 31 are cleaned at about the same rate.

Figure 4:
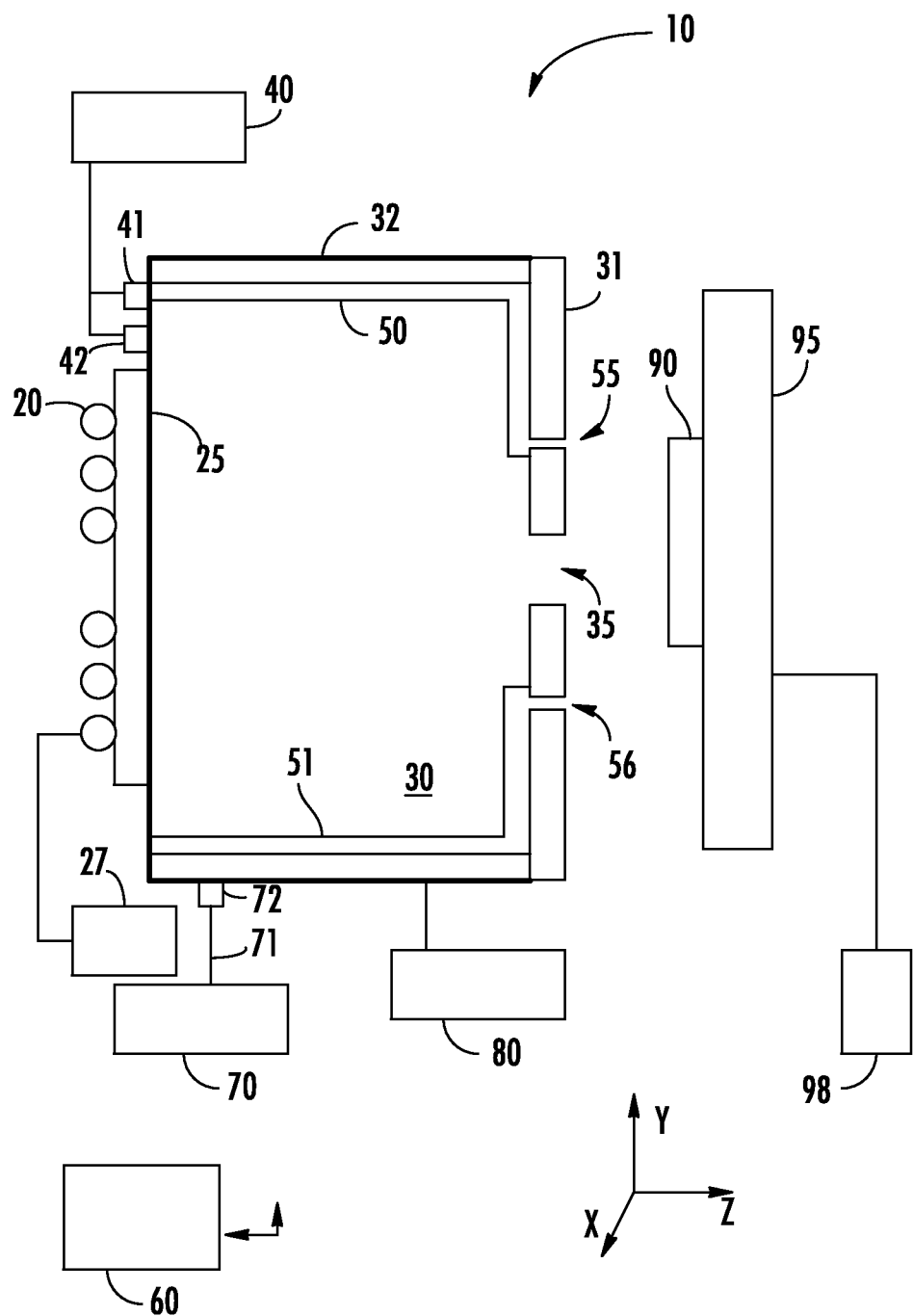
FIG. 4 is a workpiece processing apparatus in accordance with another embodiment.
Figure 5A:
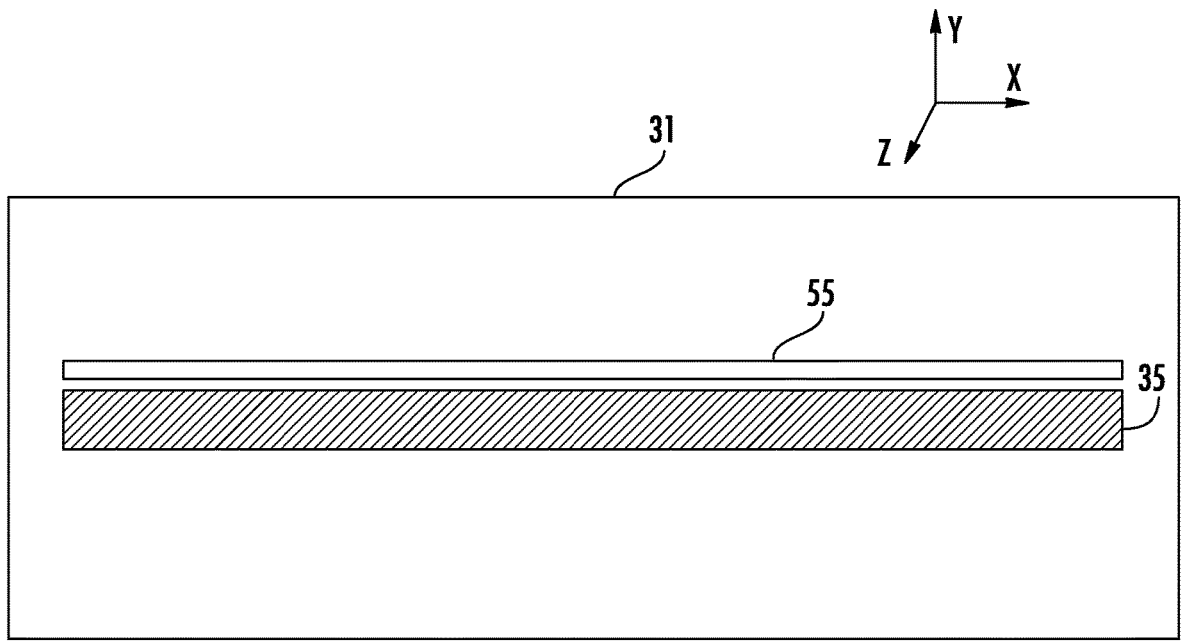
FIGS. 5A-5B show the cleaning apertures as viewed from the workpiece according to one embodiment.
Figure 5B:
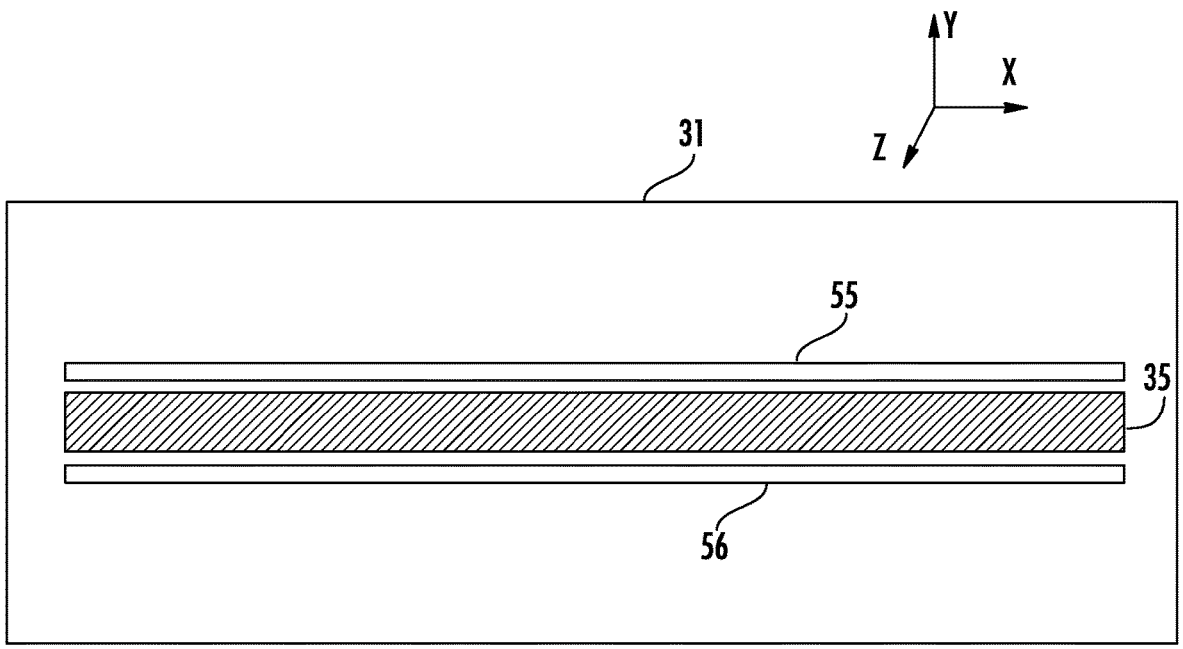

The cleaning aperture 55 may take many forms. FIG. 5A shows the extraction plate 31 as seen from the workpiece 90 according to one embodiment. The extraction plate 31 includes an extraction aperture 35 and a cleaning aperture 55 for use with the embodiment of FIG. 1. The cleaning aperture 55 is disposed on the top side of the extraction aperture 35. The cleaning aperture 55 is rectangular in shape and may be the same dimension as the extraction aperture 35 in the x-direction. In certain embodiments, the cleaning aperture 55 may be smaller than the extraction aperture 35 in the y-direction. In certain embodiments, as noted above, there may be two or more sealed tubes disposed on opposite sides of the extraction aperture 35, as shown in FIG. 4. FIG. 5B shows the embodiment of FIG. 5A with cleaning apertures 55, 56 disposed on both sides of the extraction aperture 35. This embodiment may be used with the apparatus 10 shown in FIG. 4.

Figure 6A:
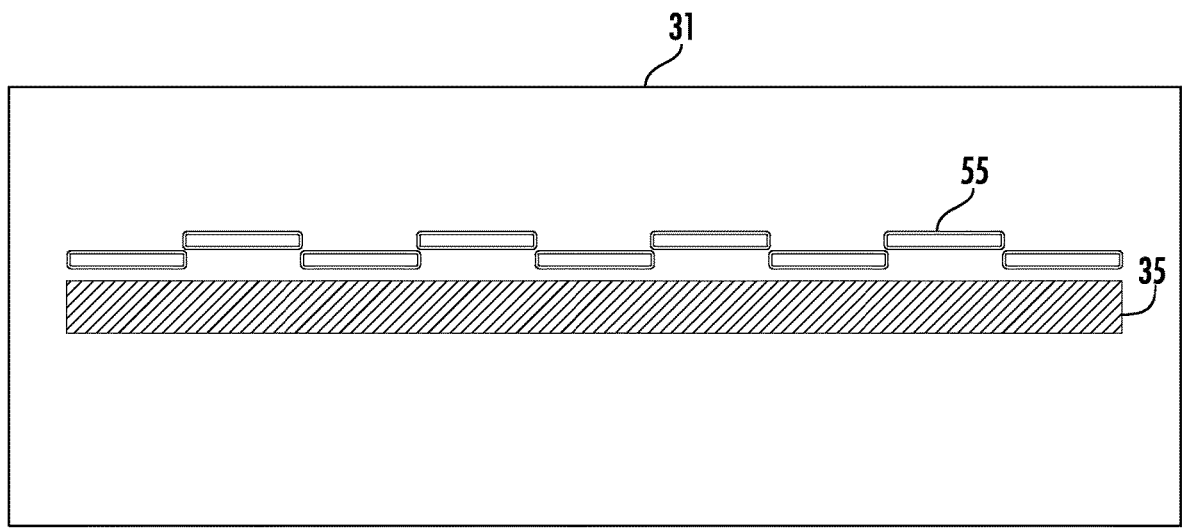
FIGS. 6A-6B show the cleaning apertures as viewed from the workpiece according to a second embodiment.
Figure 6B:
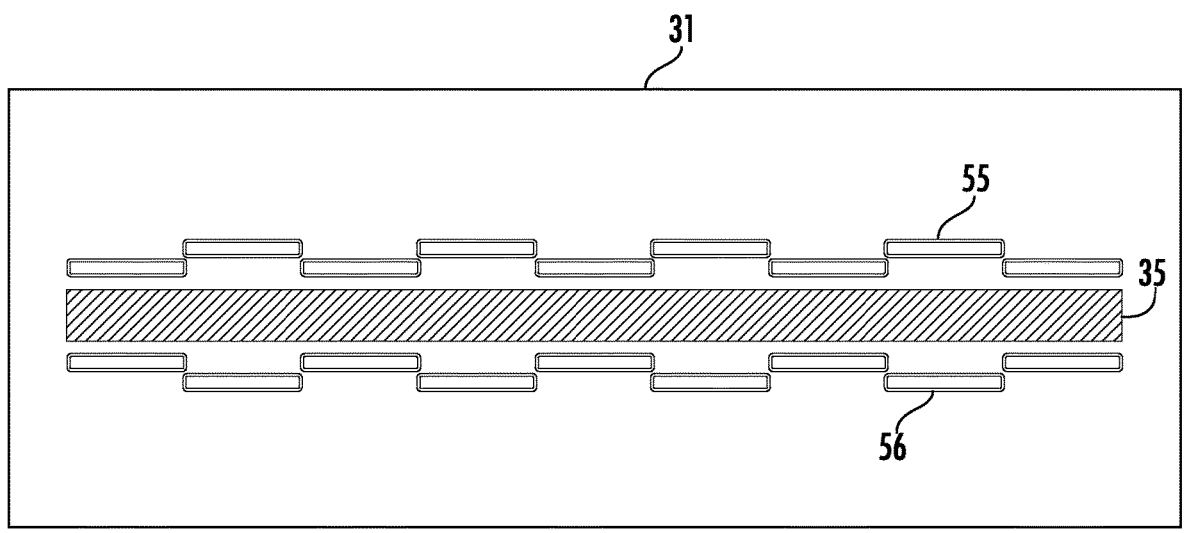

FIG. 6A shows a second embodiment of the extraction plate 31 as seen from the workpiece 90. In this embodiment, there are a plurality of cleaning apertures 55, which are staggered and disposed on the top side of the extraction aperture 35. This configuration allows more mechanical strength to remain in the extraction plate 31 but still delivers a sufficient flux of metastable atoms to the space between the extraction plate 31 and the platen 95. FIG. 6B is a variation of the extraction plate 31 shown in FIG. 6A. This embodiment, which has cleaning apertures 55, 56 disposed on both sides of the extraction aperture 35, is suitable for use with the apparatus 10 shown in FIG. 4.

Figure 7A:
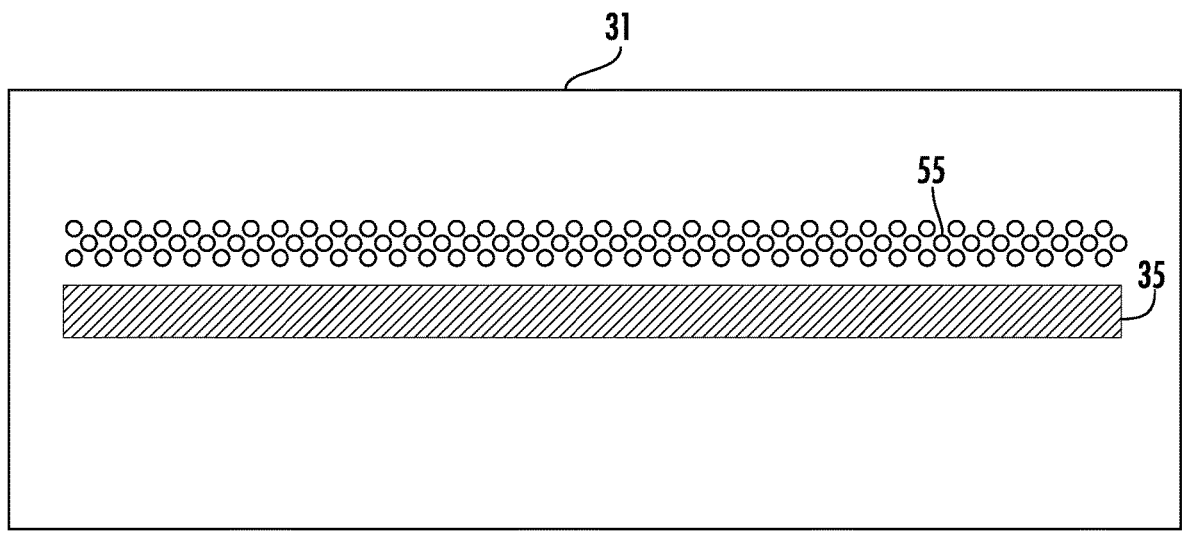
FIGS. 7A-7B show the cleaning apertures as viewed from the workpiece according to a third embodiment.
Figure 7B:
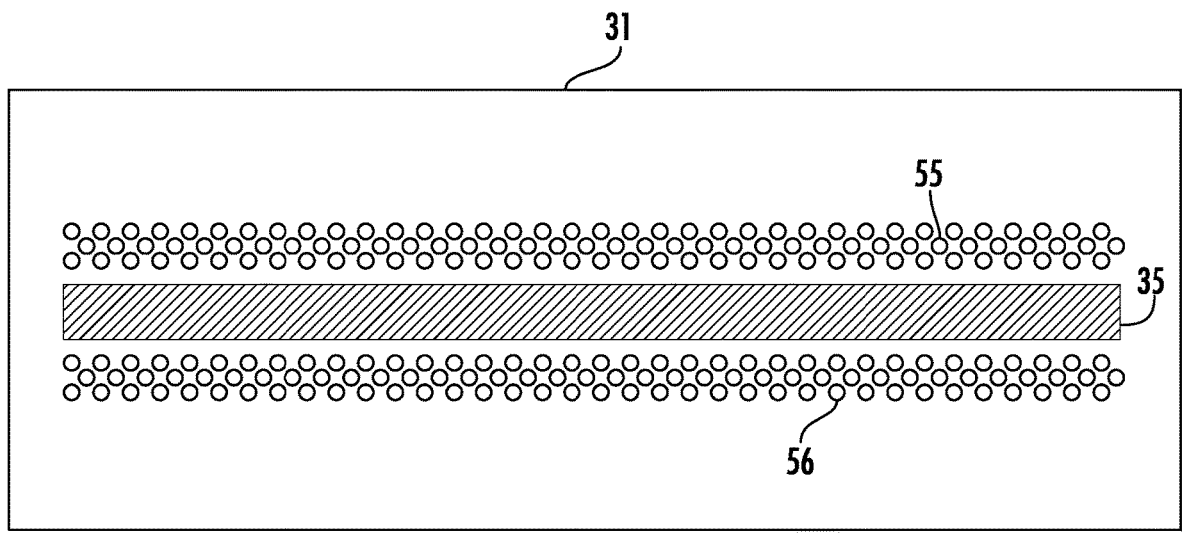

FIG. 7A shows a third embodiment of the extraction plate 31 as seen from the workpiece 90. In this embodiment, the cleaning aperture 55 comprises a plurality of circular openings. The cleaning aperture 55 is disposed on the top side of the extraction aperture 35. This configuration allows more mechanical strength to remain in the extraction plate 31 but still delivers a sufficient flux of metastable atoms to the space between the extraction plate 31 and the platen 95. FIG. 7B is a variation of the extraction plate 31 shown in FIG. 7A. This embodiment, which has cleaning apertures 55, 56 disposed on both sides of the extraction aperture 35, is suitable for use with the apparatus 10 shown in FIG. 4.

Once a cleaning operation is initiated, its duration can be determined in various ways. In one embodiment, a cleaning operation is performed for a fixed period of time. For example, it may be determined that a cleaning cycle of X minutes, executed every Y hours, is sufficient to clean the interior of the plasma chamber 30 and the extraction plate 31. Note that the duration for cleaning the plasma chamber 30 does not have to equal the duration for cleaning the extraction plate 31. Through the use of the various modes described above, the actual cleaning time for each component may be independently controlled. In certain embodiments, the cleaning processes are initiated and terminated by the controller 60.

In another embodiment, the cleaning time is determined through the use of optical emission spectroscopy (OES). In this embodiment, the components of the plasma within the plasma chamber 30 may be monitored using OES. When the concentration of the metal to the removed drops below a certain threshold, the cleaning process may be terminated. In another embodiment, the concentration of the metastable atoms is used to terminate the cleaning process. In other words, when the concentration of metastable atoms, such as fluorine, exceeds a certain value, it is implied that there is no more metal to be removed. In one embodiment, the OES system may be in communication with the controller 60, such that the controller 60 terminates the cleaning process based on feedback from the OES system.

While the above disclosure describes a sealed tube, it is appreciated that any contained volume, disposed within the plasma chamber may perform this function. For example, the plasma chamber may include a sealed volume, which is separated from the rest of the plasma chamber by a material that is transparent to RF energy. This sealed volume is in communication with the cleaning aperture and is fed by a tube mass flow controller, as described above.

The embodiments described above in the present disclosure may have many advantages. First, the use of a sealed volume to introduce metastable atoms to the space between the platen and the extraction plate allows for in situ cleaning of the extraction plate, without the need to perform a costly maintenance procedure. Second, the use of separate mass flow controllers to control the flow of cleaning gas into the tube and chamber allows the plasma chamber and the extraction plate to be cleaned at different rates, or even at different times. This allows the cleaning of the apparatus in situ, which saves time and cost. Further, this improves the throughput of the apparatus and reduces down time. Additionally, the use of multiple mass flow controllers allows the workpiece processing apparatus to operate in a plurality of modes, including an operational mode, an operational cleaning mode, an extraction plate cleaning mode, a chamber only cleaning mode and an apparatus cleaning mode. Each of these modes is readily deployed by controlling the flow of feed gas and cleaning gas into the plasma chamber and the sealed tube, as well as controlling a bias applied to the workpiece.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece processing apparatus, comprising:
   an extraction plate having an extraction aperture and a cleaning aperture;
   a plasma chamber in communication with the extraction aperture, wherein the extraction plate defines an exterior wall of the plasma chamber;
   a sealed volume disposed within the plasma chamber and in communication with the cleaning aperture;
   a tube mass flow controller in communication with the sealed volume to control a flow of a cleaning gas into the sealed volume; and
   a plasma generator, wherein the plasma generator excites gasses disposed within the plasma chamber and the cleaning gas disposed within the sealed volume.

2. The workpiece processing apparatus of claim 1, further comprising a chamber mass flow controller to control a flow of the cleaning gas into the plasma chamber.

3. The workpiece processing apparatus of claim 2, wherein the tube mass flow controller and chamber mass flow controller are independently controlled.

4. The workpiece processing apparatus of claim 2, further comprising a controller, in communication with the tube mass flow controller and the chamber mass flow controller, such that the controller can cause the apparatus to operate in a plurality of different modes.

5. The workpiece processing apparatus of claim 4, wherein the different modes are selected from the group comprising a normal operating mode, an extraction plate cleaning mode, a chamber only cleaning mode, an apparatus cleaning mode and an operational cleaning mode.

6. The workpiece processing apparatus of claim 5, wherein the controller selects a mode based on a position of a workpiece relative to the extraction aperture.

7. The workpiece processing apparatus of claim 5, further comprising a feed gas mass flow controller to control a flow of feed gas into the plasma chamber, wherein the feed gas mass flow controller is in communication with the controller.

8. The workpiece processing apparatus of claim 7, wherein, during the extraction plate cleaning mode, the feed gas flows into the plasma chamber and the cleaning gas flows into the sealed volume, and a workpiece is biased such that ions are not attracted from the plasma chamber toward the workpiece.

9. The workpiece processing apparatus of claim 7, wherein, during the chamber only cleaning mode, the cleaning gas flows into the plasma chamber and the tube mass flow controller is disabled, and a workpiece is biased such that ions are not attracted from the plasma chamber toward the workpiece.

10. The workpiece processing apparatus of claim 7, wherein, during the apparatus cleaning mode, the cleaning gas flows into the plasma chamber and the sealed volume, and a workpiece is biased such that ions are not attracted from the plasma chamber toward the workpiece.

11. The workpiece processing apparatus of claim 7, wherein, during the operational cleaning mode, feed gas flows into the plasma chamber, and a workpiece is biased such that ions are attracted from the plasma chamber toward the workpiece when the workpiece is disposed proximate the extraction aperture, and cleaning gas flows into the sealed volume when the workpiece is not biased.

12. The workpiece processing apparatus of claim 1, wherein the sealed volume is created using a material that is transparent to RF energy, such that plasma generated in the plasma chamber excites the cleaning gas.

13. A workpiece processing apparatus, comprising:
    an extraction plate having an extraction aperture and a cleaning aperture;
    a plasma chamber in communication with the extraction aperture, wherein the extraction plate defines an exterior wall of the plasma chamber;
    a sealed volume disposed within the plasma chamber and in communication with the cleaning aperture;
    a plasma generator, wherein the plasma generator excites gasses disposed within the plasma chamber and gas disposed within the sealed volume; and
    a controller to control a flow of feed gas into the plasma chamber, a flow of a cleaning gas into the plasma chamber and a flow of cleaning gas into the sealed volume, so as to independently control cleaning of an interior of the plasma chamber and an exterior surface of the extraction plate.

14. The workpiece processing apparatus of claim 13, wherein a workpiece is disposed on a platen, the platen biased using a bias power supply, wherein the controller is in communication with the bias power supply.

15. The workpiece processing apparatus of claim 14, wherein the controller flows the feed gas into the plasma chamber, and the workpiece is biased such that ions are attracted from the plasma chamber toward the workpiece when the workpiece is disposed proximate the extraction aperture, and the controller flows the cleaning gas into the sealed volume when the workpiece is not biased.

16. The workpiece processing apparatus of claim 14, wherein the workpiece is biased so as not to attract ions toward the workpiece when the plasma chamber is being cleaned.

17. The workpiece processing apparatus of claim 13, wherein the cleaning gas comprises a halogen.

18. The workpiece processing apparatus of claim 13, wherein the sealed volume is created using a material that is transparent to RF energy, such that plasma generated in the plasma chamber excites the cleaning gas.

* * * * *